(12) United States Patent
Chen

(10) Patent No.: US 9,208,130 B1
(45) Date of Patent: Dec. 8, 2015

(54) PHASE INTERPOLATOR

(75) Inventor: Ming-Shuan Chen, Los Angeles, CA (US)

(73) Assignee: XILINX, INC., San Jose, CA (US)

(*) Notice: Subject to any disclaimer, the term of this patent is extended or adjusted under 35 U.S.C. 154(b) by 367 days.

(21) Appl. No.: 13/587,691

(22) Filed: Aug. 16, 2012

(51) Int. Cl.
*G06F 17/17* (2006.01)

(52) U.S. Cl.
CPC ...................... *G06F 17/17* (2013.01)

(58) Field of Classification Search
None
See application file for complete search history.

(56) References Cited

U.S. PATENT DOCUMENTS

| | | | |
|---|---|---|---|
| 7,557,619 B1 | 7/2009 | Dick et al. | |
| 2003/0165209 A1* | 9/2003 | Chen et al. | 375/376 |
| 2009/0121796 A1* | 5/2009 | Patterson | 331/45 |

OTHER PUBLICATIONS

Marcu, C., et al., "A 90 nm CMOS Low-Power 60 GHz Transceiver With Integrated Baseband Circuitry", IEEE Journal of Solid-State Circuits, vol. 44, No. 12, pp. 1-14, Dec. 2009.

* cited by examiner

*Primary Examiner* — Michael D Yaary
(74) *Attorney, Agent, or Firm* — John J. Kling

(57) ABSTRACT

A phase interpolator is described. The phase interpolator may comprise a first plurality of digital-to-analog converters coupled to receive a first phase of a clock signal; a second plurality of digital-to-analog converters coupled to receive a second phase of the clock signal; and a third plurality of digital-to-analog converters coupled to both the first phase of the clock signal and the second phase of the clock; wherein each digital-to-analog converter is configurable to receive either the first phase of the clock signal or the second phase of the clock signal. A method of implementing a phase interpolator is also described.

20 Claims, 8 Drawing Sheets

| Phase Code | Phase Θ | I | Q | I-DAC | Q-DAC | S-DAC For I | S-DAC For Q | Total DAC |
|---|---|---|---|---|---|---|---|---|
| 00000 | 00000 | 24 | 0 | 12 | 0 | 12 | 0 | 24 |
| 00001 | 2.8125 | 22 | 1 | 10 | 1 | 12 | 0 | 23 |
| 00010 | 6 | 22 | 2 | 10 | 2 | 12 | 0 | 24 |
| 00011 | 8.4375 | 22 | 3 | 10 | 3 | 12 | 0 | 25 |
| 00100 | 11.25 | 24 | 5 | 12 | 5 | 12 | 0 | 29 |
| 00101 | 14 | 24 | 6 | 12 | 6 | 12 | 0 | 30 |
| 00110 | 16.875 | 23 | 7 | 11 | 7 | 12 | 0 | 30 |
| 00111 | 19.6875 | 22 | 8 | 10 | 8 | 12 | 0 | 30 |
| 01000 | 23 | 24 | 10 | 12 | 10 | 12 | 0 | 32 |
| 01001 | 25.3125 | 21 | 10 | 9 | 10 | 12 | 0 | 31 |
| 01010 | 28.125 | 21 | 11 | 10 | 10 | 11 | 0 | 31 |
| 01011 | 31 | 20 | 12 | 10 | 10 | 10 | 0 | 30 |
| 01100 | 33.75 | 21 | 14 | 12 | 11 | 9 | 3 | 32 |
| 01110 | 36.5625 | 19 | 14 | 11 | 10 | 8 | 4 | 29 |
| 01110 | 39 | 17 | 14 | 10 | 9 | 7 | 5 | 26 |
| 01111 | 42.1875 | 19 | 17 | 12 | 12 | 7 | 5 | 31 |
| 01000 | 45 | 17 | 17 | 11 | 11 | 6 | 6 | 30 |

PHASE INTERPOLATOR

FIELD OF THE INVENTION

An embodiment relates generally to integrated circuits, and in particular, to a phase interpolator and to a method of implementing a phase interpolator.

BACKGROUND OF THE INVENTION

A phase interpolator (PI) plays an important role in a serial-link transceiver design. A phase interpolator is a circuit that has two periodic input signals which typically have the same period of oscillation and are derived from the same source. The two input signals are commonly referred to as I and Q phases of a clock signal, which could be 90 degrees apart, for example. A conventional phase interpolator generates arbitrary phases by switching the number of I and Q components, where the total number of I and Q components is a constant, thereby reducing the number of digital-to-analog converters (DACs)

Although the use of a phase interpolator in a data receiver provides many advantages such as low power consumption and high area efficiency, it demonstrates drawbacks that limit the performance. While the hardware cost of a conventional phase interpolator is low in view of the reduced number of DACs, a conventional phase interpolator generates an output which has a large amount of nonlinearity. Such nonlinearity can be significant if the phase interpolator is followed by an amplitude sensitive circuit, such as a voltage converter circuit. Because the I and Q clock signals (such as 0 and 90 degree phases of a clock signal) are never ideal sine waves, the generated clock still demonstrates non-ideal clock phase. The nonlinearity not only increases clock jitter, but can also lead the entire clock and data recovery functionality of a circuit to fail.

SUMMARY OF THE INVENTION

According to an embodiment, a phase interpolator is described. The phase interpolator comprises a first plurality of digital-to-analog converters coupled to receive a first phase of a clock signal; a second plurality of digital-to-analog converters coupled to receive a second phase of the clock signal; and a third plurality of digital-to-analog converters coupled to both the first phase of the clock signal and the second phase of the clock; wherein each digital-to-analog converter is configurable to receive either the first phase of the clock signal or the second phase of the clock signal.

According to an alternate embodiment, a phase interpolator comprises a plurality of digital-to-analog converters; and a control circuit coupled to the plurality of digital-to-analog converters; wherein a portion of the plurality of digital-to-analog converters are coupled to receive control signals from the control circuit which enable receiving, for each digital-to-analog converter of the portion of digital-to-analog converters, either a first phase of a clock signal or a second phase of the clock signal.

A method of implementing a phase interpolator is also described. The method comprises coupling a first phase of a clock signal to a first plurality of digital-to-analog converters; coupling a second phase of the clock signal to a second plurality of digital-to-analog converters; and coupling both the first phase of the clock signal and the second phase of the clock to a third plurality of digital-to-analog converters, wherein each digital-to-analog converter of the third plurality of digital-to-analog converters is configurable to receive either the first phase of the clock signal or the second phase of the clock signal.

DETAILED DESCRIPTION OF THE DRAWINGS

Figure 1:
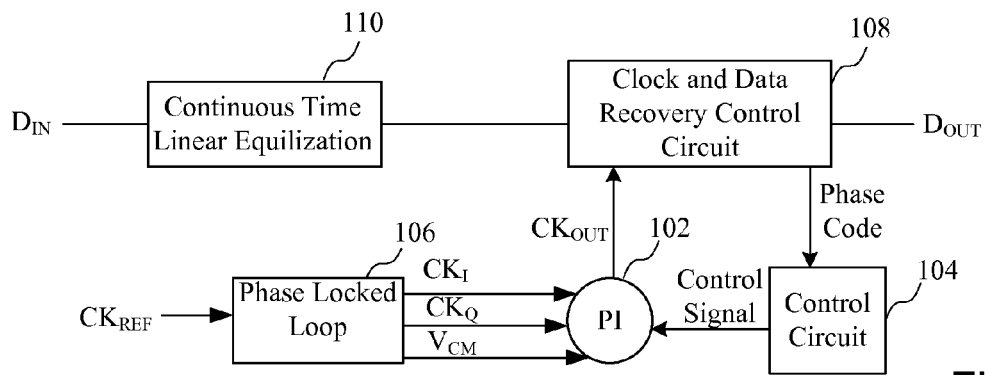
FIG. 1 is a block diagram of a circuit implementing a phase interpolator according to an embodiment.

Turning first to FIG. 1, a block diagram of a data receiver circuit implementing a phase interpolator according to an embodiment is shown. The data receiver circuit 100 of FIG. 1 receives input data ($D_{IN}$) and generates output data ($D_{OUT}$) using a phase interpolator 102. The phase interpolator 102 receives controls signals from a control circuit 104 and different phases $CK_I$ and $CK_Q$ of a clock signal from a phase locked loop 106 coupled to receive a reference clock signal $CK_{REF}$. The phase interpolator 102 generates an output clock $CK_{OUT}$ based upon control signals generated by the control circuit 104. A clock and data recovery circuit 108 receives the input data from a continuous time linear equalization (CTLE) circuit 110 and generates the output data using generated output clock $CK_{OUT}$. The clock and data recovery control circuit 108 provides a phase code to the control circuit 104 to enable the phase interpolator 102 to generate an output clock having the correct phase. If the phase of the input data stream changes, requiring a different phase of the output clock signal $CK_{OUT}$, the clock and data recovery control circuit 108 will detect the change and generate a new phase code to ensure that the correct phase of the output clock signal is generated by the phase interpolator to correctly receive the input data. The functionality of the control circuit 104 will be described in more detail in reference to FIGS. 4-6.

Figure 2:
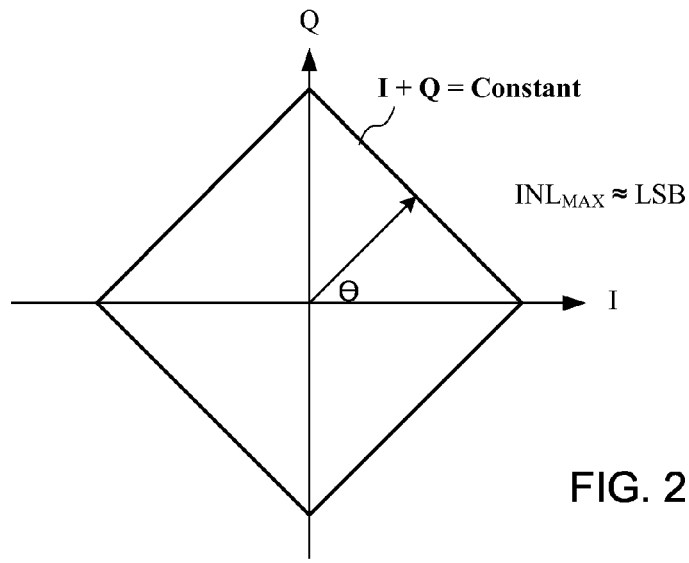
FIG. 2 is a coordinate axis showing coefficients where the sum of the I and Q components is a constant according to an embodiment.

Turning now to FIG. 2, a coordinate axis show combinations of I and Q components for phases of a clock signal, such as the output clock signal $CK_{OUT}$ of the phase interpolator, where the sum of the I and Q components for any given phase is a constant. To generate an ideal clock with phase, the weighting coefficient for I and Q clock components should be COS and SIN, respectively. However, most conventional phase interpolators are designed by fixing the I and Q components such that the sum of the amplitude of the I component and the amplitude of the Q component is always equal to a constant. That is, the sum of the I and Q components will be on a line representing I+Q=constant as shown. While some specific examples set forth below are provided for a clock signal having a phase angle in the first quadrant, it should be understood the phase of the clock signal could be generated in any of the quadrants.

Although the hardware cost of a phase interpolator implemented according to the constraint of FIG. 2 is significantly reduced, it does not take into account the effect of the difference in amplitude for the different phases. For example, the amplitude of the vector from the axis to the line defining the relationship I+Q=N will be less when =45 degrees than when =0 or 90 degrees. This difference in amplitude can cause significant nonlinearity in the phase interpolator, which can result in errors in the output clock signal, especially if a voltage converter is implemented. According to the embodiment of FIG. 2, the maximum integral nonlinearity ($INL_{MAX}$) is approximately equal to the least significant bit (LSB) in the DAC. As will be described in more detail below, the weight of the LSB of the DAC is equal to the full scale voltage range of the converter divided by $2^N$, where N is the resolution of the converter. As the integral nonlinearity approaches the LSB, the performance of the phase interpolator will be degraded.

Figure 3:
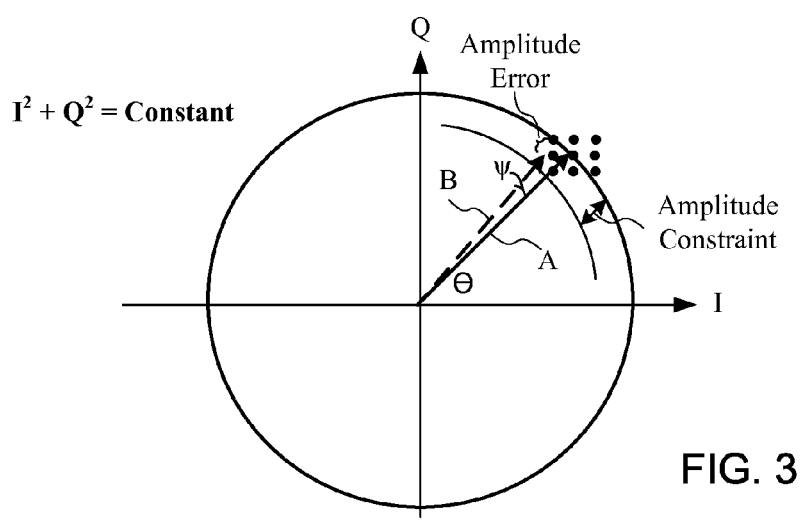
FIG. 3 is a coordinate axis showing coefficients where the sum of the square of the I and Q components is a constant according to an embodiment.

As can be seen in FIG. 3, the I and Q components have a relationship where the sum of the square of the I and Q components is a constant. As is apparent in FIG. 3, the amplitude of the vectors is the same for every phase angle. In conventional phase interpolators having the constraint set forth in FIG. 2 for example, the phase error is 0 and the amplitude error is 0.3 for a 45 degree phase angle with I=Q=N/2. While the constraint of FIG. 3 provides improvement in nonlinearity (compared to the constraint of FIG. 2) by forcing the amplitude at any phase to be a constant, implementing a circuit which provides a fixed amplitude according to the constraint of FIG. 3 also has drawbacks. For example, in order to generate the fixed amplitude, twice the number of DAC circuits would be needed compared to a circuit implemented according to the constraints of FIG. 2. That is, while N DACs would be needed to establish the relationship of I and Q according to the requirement of FIG. 2, 2N DACs would be needed to establish the relationship of I and Q according to the requirement of FIG. 3. However, the additional DACs introduce additional parasitic capacitance and increase power consumption. For most phase interpolators, the bandwidth of the phase interpolator is usually limited by the parasitic capacitance. As a result, for high clock frequencies, doubling the parasitic capacitance can more than double the power consumption.

As shown in FIG. 3, the ideal clock phase is shown in the solid line. However, both the amplitude and phase may be different than the idea clock phase due to the DAC resolution, as shown by the resulting clock phase shown in dashed lines. The number of DACs will determine the resolution of available points associated with the I and Q values on the I/Q coordinate axes. As shown in FIG. 3, an amplitude error is defined by the amplitude difference between the ideal clock phase and the resulting clock phase, and the phase error ψ is defined by the angle between the ideal clock phase and the resulting clock phase. When a greater number of DACs is used, the amplitude error and the phase error of a clock signal generated by the phase interpolator can be reduced. Because the maximum amplitude of I+Q is about equal to 1.414*Amplitude (i.e. which is smaller than 1.5), the number DACs can be decreased by sharing N/2 DAC between the I and Q paths according to the embodiment of FIG. 3. The selection of an overall number of DACs to achieve a desired resolution for the phase interpolator will be described below, in further reference to FIG. 3.

Figures 4, 5:
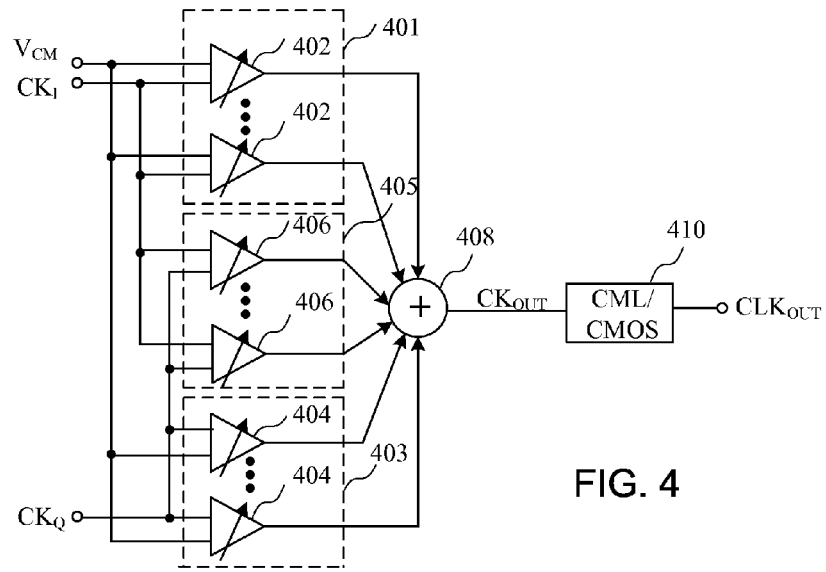
FIG. 4 is a block diagram of a phase interpolator according to an embodiment.
FIG. 5 is a table showing the allocation of DACs according to an embodiment.

Turning now to FIG. 4, a phase interpolator having DACs is shown. In order to address the problem of increased parasitic capacitance when additional DACs are implemented to reduce amplitude error, the circuit of FIG. 4 implements a shared I/Q phase interpolator technique. More particularly, in addition to DACs dedicated to I components (I-DACs) and DACs dedicated to Q components (Q-DACs), additional shared DACs (S-DACs) are implemented. As will be described in more detail below, the shared DACs are configurable to function as either an I-DAC or a Q-DAC. The use of shared DACs reduces the number of overall DACs required to implement the phase interpolator, and therefore reduces the parasitic capacitance of the phase interpolator.

According to the embodiment of FIG. 4, a first set of DACs 401 comprises I-DACs 402 which are coupled to receive both a first phase $CK_I$ of an input clock and a common mode voltage $V_{CM}$. As will be described in more detail below, the common mode voltage will be used to generate a common mode output signal at the output of a DAC which is not selected to contribute to the output clock signal of the phase interpolator. A second set of DACs 403 comprises Q-DACs 404. The Q-DACs each receive an second phase $CK_Q$ of the input clock signal and the common mode voltage VCM. A third set of DACs 405 comprise shared DACs, designated S-DACs 406. Each of the S-DACs receives both the first phase of $CK_I$ and the second phase $CK_Q$ of the input clock signal.

Each of the DACs of FIG. 4 is configured to select one of the two inputs to the DAC. Therefore, each of the I-DACs and the Q-DACs will output a common mode output (i.e. an output having the same voltage on the differential outputs nodes, or a zero differential output) or a differential clock signal based upon the $CK_I$ or $CK_Q$ clock signals, respectively. However, each of the S-DACs will generate a differential output clock signal based upon a selected one of the $CK_I$ or $CK_Q$ clock signals. The outputs of all of the DACs are provided to summing circuit 408 which adds the various output clock signals to generate the output clock signal $CK_{OUT}$ of the phase interpolator. The voltage of the output clock signal optionally may then be converted to another voltage. For example, the clock signal may be converted from a first voltage by a voltage converter 410, such as a CKL-to-CMOS voltage converter, to an output clock signal $CLK_{OUT}$ having a second voltage.

The table of FIG. 5 provides an example of how the use of S-DACs reduces the overall requirements for DACs. A particular phase of a clock signal is generated based upon a digital code, such as the phase code of FIG. 1. While 16 digital codes and corresponding phases are provided by way of example in the table of FIG. 5, phase interpolators having a different resolution could be implemented according to other embodiments. As is apparent, 24 I components would be required for a 0 degree phase, while 24 Q components would be required for a 90 degree phase. Accordingly, a total of 48 DACs (i.e. 24 DACs for I components and 24 DACs for Q components) would be required without the use of S-DACs. However, in a case where a maximum number of I-DACs (or Q-DACs) is required, no Q-DACs (or I-DACs) are required. Further, in a case where less than the maximum number of I-DACs or Q-DACs is required, less than the maximum of the other of I-DACs or Q-DACs, respectively, are needed. Accordingly, a reduced total number of I-DACs and Q-DACs can be provided by implementing S-DACs, where fewer than the maximum number of required I-DACs and Q-DACs are implemented as dedicated DACs. As shown in the table, less than 1.5 times 24, or less than 36 total DACs will be required by implementing shared DACs. Accordingly, the usage of S-DACs provides a constant amplitude with only a 50% increase in DACS, and therefore only a 50% increase in parasitic capacitance.

As shown in the table of FIG. 5, 36 DACs can be allocated such that 12 DACs are designated as dedicated I-DACs, 12 DACs are designated as dedicated Q-DACs, and 12 DACs are designated as S-DACs. Because the table of FIG. 5 relates to a phase angle of between 0 and 45 degrees, the I component of the phase angle is greater (except for when equals 45 degrees where the I and Q components are equal), and therefore more of the S-DACs will be implemented as I-DACs than Q-DACs. For equal to zero degrees, each of the 12 I-DACs will be used, and all of the S-DACs will be implemented as I-DACs. For the case of 31 degrees, 20 I-DACs and 12 Q-DACs are needed. Therefore, 8 of the S-DACs are implemented as I-DACs and 2 of the S-DACs are implemented as Q-DACs. It should be noted that 2 of the Q-DACs are not used, and therefore will generate a common node voltage output. For the case of 45 degrees, 17 I-DACs and 17 Q-DACs are required. Therefore, 11 of the I-DACs are supplemented with 6 of the S-DACs implemented as I-DACs, and 11 of the Q-DACs are supplemented with 6 of the S-DACs implemented as Q-DACs. One of each of the I-DACs and Q-DACs will not be used.

As a result, the proposed shared I/Q DAC implementation can achieve low amplitude variation with only a 50% increase of parasitic capacitance. That is, only a total of 36 DACs are required, rather than a required 48 DACs if all of the DACs were implemented as either a dedicated I-DAC or Q-DAC. While a total of 36 DACs is shown by way of example according to the embodiment of FIG. 5, other numbers of DACs or another allocation of I-DACs, Q-DACs and S-DACs may be implemented to meet any relevant criteria for implementing a phase interpolator. The control circuit 104 of FIG. 1 can decode the phase code from the clock and data recover control circuit 108, and generate control signals necessary to implement the various DACs as I-DACs, Q-DACs, and S-DACs.

Figure 6:
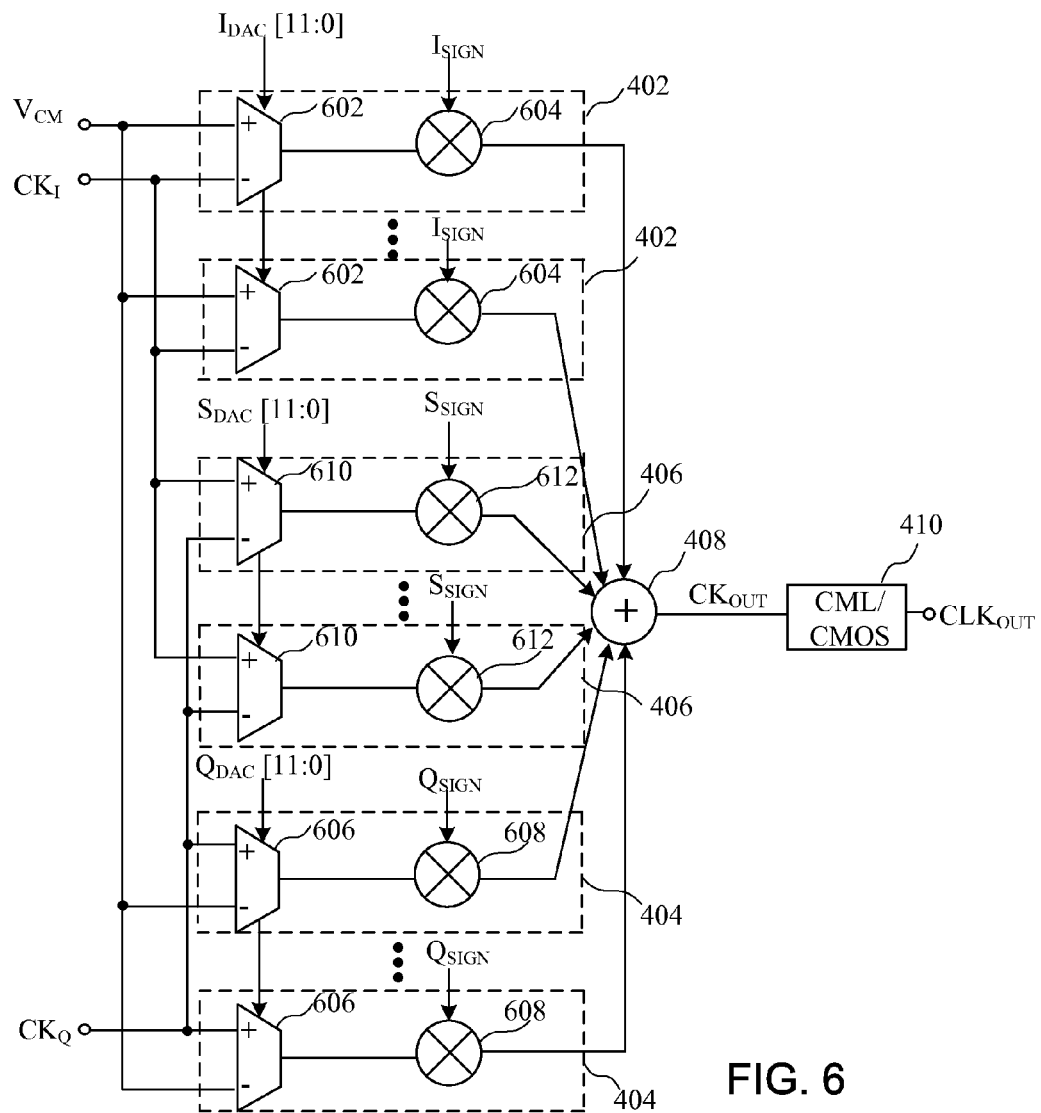
FIG. 6 is a more detailed block diagram of the phase interpolator of FIG. 4.

Turning now to FIG. 6, a more detailed block diagram of the phase interpolator of FIG. 4 is shown. As shown in FIG. 6, each of the DACs 402, 404 and 406 comprises a first stage which selects one of two inputs, and a second stage which selects a sign of the output signal. In particular, each of the I-DACs 402 comprises a first stage 602 for selecting either the clock signal $CK_I$ or the common mode voltage $V_{CM}$, and a second stage 604 for selecting a sign of the output signal. Similarly, each of the Q-DACs 404 comprises a first stage 606 for selecting either the clock signal $CK_Q$ or the common mode voltage $V_{CM}$, and a second stage 608 for selecting a sign of the output signal. Further, each of the Q-DACs 406 comprises a first stage 610 for selecting either the clock signal $CK_Q$ or the common mode voltage $V_{CM}$, and a second stage 612 for selecting a sign of the output signal. The first stages 602, 606, and 610 will be described in more detail in reference to FIG. 8, and the second stages 604, 608, and 610 will be described in more detail in reference to FIG. 9.

The $I_{DAC}$ [11-0] signal is a control signal which selects which of the 12 I-DACs is configured to receive the $CK_I$ input or the $V_{CM}$ input. Similarly, The $Q_{DAC}$ [11-0] signal is a control signal which selects which of the 12 Q-DACs is configured to receive the $CK_Q$ input or the $V_{CM}$ input. The $S_{DAC}$ [11-0] signal is a control signal which selects which of the 12 S-DACs is configured to receive the $CK_I$ input or the $CK_Q$ input. The circuit of FIG. 4 could be implemented according to the table of FIG. 5, where the $I_{DAC}$ [11-0], $Q_{DAC}$ [11-0], and $S_{DAC}$ [11-0] signal are control signals generated by the control circuit 104 based upon a phase code generated by the clock and data recovery control circuit 108.

An important design parameter of a phase interpolator is the resolution of the DACs, which is based upon the LSB of the DACs. According to one embodiment, the following phase selection method enables selecting DAC resolution. The resolution of DAC is assigned to be N. As shown in FIG. 3, for example, the value of N would determine the number of discrete points along the periphery of the line that defines the constant amplitude. The amplitude error and phase error of every possible points is then calculated. An amplitude constraint parameter, as shown in FIG. 3, is also assigned. Points whose amplitude error is larger than the amplitude constraint are abandoned. The point with a minimized phase error is picked from the remaining points.

While the INL due to limited DAC resolution can be improved by simply adding DACs, this can increase power consumption, layout difficulty, and output parasitic capacitance. Further, the INL due to amplitude modulation-to-phase modulation (AM-to-PM modulation) can only be improved by increasing output amplitude or decreasing amplitude variation by increasing DAC resolution. Finally, the INL due to DAC nonlinearity can be improved by decreasing input amplitude or increasing power consumption. Because it may be beneficial to balance the INL due to the three effects, the INL due to DAC resolution can be chosen to be 0.2-LSB according to one embodiment, so the number of DACs is chosen to be 48. The input clock amplitude may be 200-mV, for example, where a smaller amplitude leads to a better linearity, but does not adversely affect the AM-to-PM modulation.

One of the most significant sources of PI nonlinearity is the result of AM-to-PM modulation, where the maximum amplitude error is determined by the AM-to-PM modulation. The amplitude variation between different codes can lead to significant phase nonlinearity if circuits after the phase interpolator have a high gain, such as from the CML-to-CMOS converter. Without a limiting amplifier, a CML-to-CMOS buffer demonstrates an AM-to-PM conversion gain of 0.14 degree/mV. Therefore, even a small amplitude variation of 10 mV can lead to a 1.4-degree, 0.5-LSB phase error. As a result, it is beneficial to either add a linear amplifier at the output of the PI, or try to minimize amplitude variation to minimize the effect of AM-to-PM modulation, as will be described in more detail below.

Another parameter that can affect the gain of AM-to-PM modulation is the PI output voltage amplitude. The smaller the PI output amplitude, the larger AM-to-PM modulation gain that is required by the CML-to-CMOS converter. If the input amplitude to the CML-to-CMOS converter is large enough, the output waveform will saturate and the phase error is then small. If the input amplitude is small, than the output waveform becomes very sensitive to the amplitude and can cause significant AM-to-PM modulation. The phase interpolator attempts to maximize the PI output amplitude and minimize the AM-to-PM modulation caused by CML-to-CMOS converter.

DAC linearity is another significant source of PI nonlinearity. The output clock of the PI is not a pure sine wave due to nonlinearity of DAC. One source of nonlinearity can come from the switching behavior of NMOS transistors. If the input voltage swing is large, the output will be saturated, which leads to 3rd harmonic distortion and PI nonlinearity. Consequently, one way to improve linearity of the PI is based upon design considerations of NMOS transistors as will be described in more detail below in reference to FIG. 10. Because increasing the amplitude leads to a larger total harmonic distortion (THD), and thus INL, another way to improve the linearity is to decrease the input amplitude swing. However, amplitude cannot be arbitrary small because very small output PI amplitude can cause very serious AM-to-PM modulation, which may lead to more INL. Additional circuits for implementing a phase interpolator which affect the gain of the AM-to-PM modulation and nonlinearity will be described in reference to FIGS. 7-13.

Figure 7:
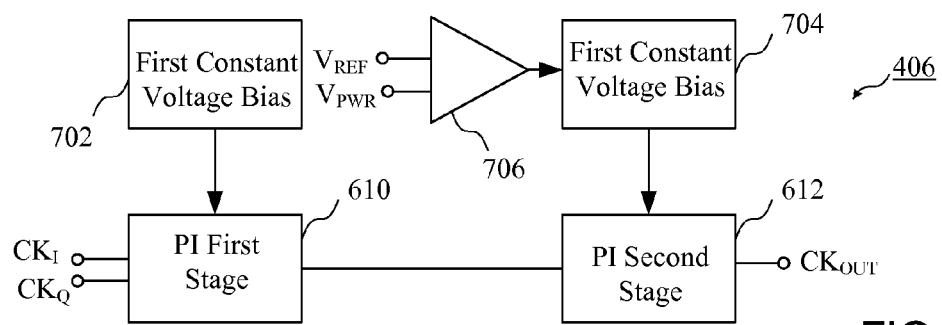
FIG. 7 is a block diagram of a DAC according to an embodiment.

Turning now to FIG. 7, a block diagram of S-DAC 406 according to an embodiment is shown. The S-DAC 406 comprises the first stage 610 and the second stage 612, and is coupled to each of the first phase $CK_I$ and the second phase $CK_Q$ of the clock signal. A first constant voltage bias circuit 702 is coupled to the first stage 610. The first constant voltage bias circuit 702 will be described in more detail in reference to FIG. 11. The second stage 612 is coupled to a second constant voltage bias circuit 704. The second constant voltage bias circuit 704 receives an output of a comparator 706 which is coupled to receive a reference voltage and an output $V_{PWR}$ of a power detector circuit. The constant voltage circuit 704 will be described in more detail in reference to FIG. 12. While the circuit of FIG. 7 is shown in reference to the S-DAC 406, it should be understood that the same circuit could be used for the I-DACs 402 and Q-DACs 404. For example, the I-DAC 402 would receive the clock phase $CK_I$ and the common mode voltage $V_{CM}$, while the Q-DAC 406 would receive the clock phase $CK_Q$ and the common mode voltage $V_{CM}$.

Figure 8:
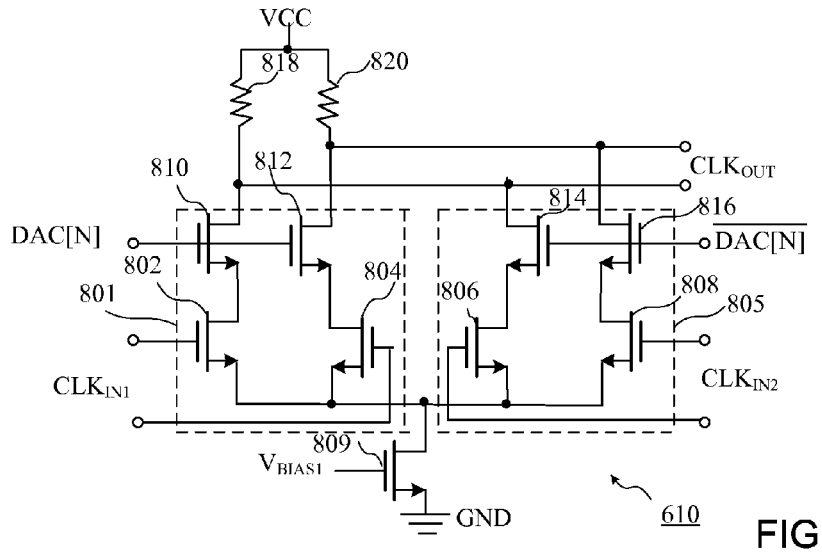
FIG. 8 is a block diagram of a first stage of the DAC of FIG. 7 according to an embodiment.

Turning now to FIG. 8, a block diagram of the first stage 610 of the phase interpolator of FIG. 7 according to an embodiment is shown. The first stage 610 comprises a first input portion 801 comprising transistors 802 and 804 coupled to the differential clock input $CLK_{IN1}$ at their respective gates, and a second input portion 805 comprising transistors 806 and 808 receiving the differential clock input $CKL_{IN2}$ at their respective gates. The sources of each of the transistors 802-808 are coupled to drain of a transistor 809 having its source coupled to ground. The gate of the transistor 809 is coupled to receive a $V_{BIAS1}$ input which will control the current driven through the each of the first and second stages. The generation of the $V_{BIAS1}$ input will be described in more detail in reference to FIG. 11.

The first input portion 801 further comprises control transistors 810 and 812 having sources coupled to the drains of the transistors 802 and 804, respectively. The drains of the transistors 810 and 812 are each coupled to a corresponding terminal of resistors 818 and 820, where a second terminal of the resistors 818 and 820 is coupled to a reference voltage VCC. A control signal DAC[N] is coupled to the gates of each of the transistors 810 and 812, where N corresponds to a particular I-DAC, Q-DAC or S-DAC. In the example in the table of FIG. 5, the control signal DAC[N] would correspond to one of the 36 DACs.

The second input portion comprises control transistors 814 and 816 having sources coupled to the drains of the transistors 806 and 808, respectively. The drains of the transistors 814 and 816 are each coupled to corresponding terminals of the resistors 818 and 820. An inverted control signal DAC[N]_BAR is coupled to the gates of each of the transistors 814 and 816. A differential $CLK_{OUT}$ signal is generated at the drains of transistors 810, 812, 814 and 816 where the $CLK_{OUT}$ signal will be based upon either the $CLK_{IN1}$ signal or the $CLK_{IN2}$ signal. That is, the SIGN[N] signal will select either the first input portion 801 (and therefore $CLK_{IN1}$) or the second input portion 805 (and therefore $CLK_{IN2}$) to generate the $CLK_{OUT}$ signal which contributes to the $CK_{OUT}$ of the phase interpolator.

If a DAC having the first stage of FIG. 8 is implemented in an I-DAC, the first stage of FIG. 8 will receive $CK_I$ for the $CLK_{IN1}$ signal and $V_{CM}$ for the $CLK_{IN2}$ signal. If the $CK_I$ of an I-DAC is intended to contribute to the $CK_{OUT}$ of the phase interpolator, then DAC[N] will be high to select $CK_I$ to generate the $CLK_{OUT}$ signal. Similarly, if the $CK_Q$ of a Q-DAC (N) is intended to contribute to the $CK_{OUT}$ of the phase interpolator, then DAC[N]-BAR will be high to select $CK_Q$ to generate the $CLK_{OUT}$ signal. Alternatively, if either the I-DAC or the Q-DAC is not intended to contribute to the $CK_{OUT}$ of the phase interpolator, the DAC[N] signal is selected so that the common mode voltage $V_{CM}$ is applied to the gates of both transistors 806 and 808 to generate a null output (i.e. where the two output terminals of the differential output are the same) at $CLK_{OUT}$. In the case where the DAC implementing the circuit of FIG. 8 is an S-DAC, $CK_I$ and $CK_Q$ correspond to $CLK_{IN1}$ and $CLK_{IN2}$, respectively. Accordingly, for an S-DAC, a selected one of the $CK_I$ or $CK_Q$ clock signals would contribute to the $CK_{OUT}$ of the phase interpolator.

Figure 9:
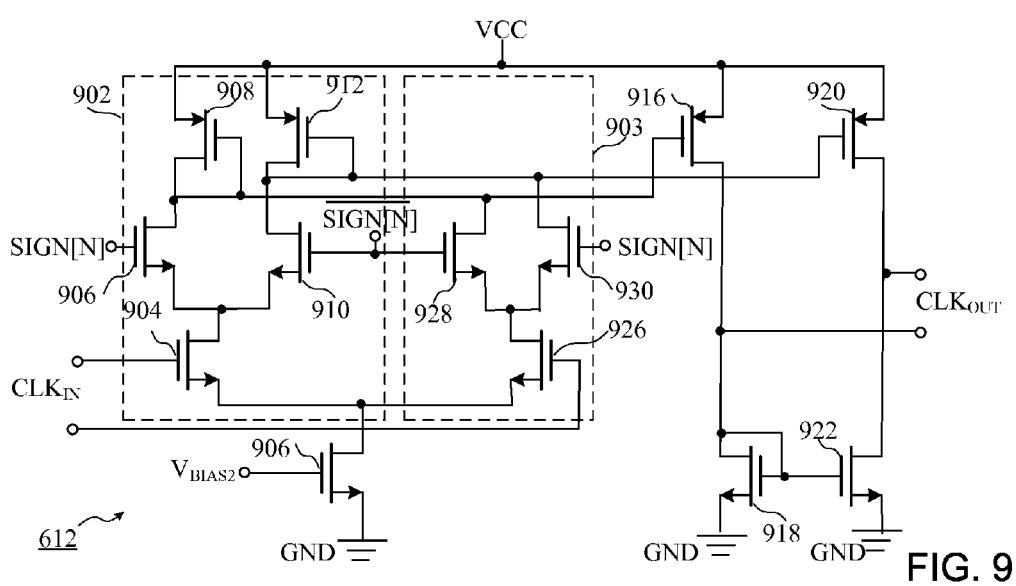
FIG. 9 is a block diagram of a second stage of the DAC of FIG. 7 according to an embodiment.

Turning now to FIG. 9, a block diagram of a second stage of the phase interpolator of FIG. 7 according to an embodiment is shown. The second stage of the DAC of FIG. 9 receives the $CLK_{OUT}$ output of the first stage of the DAC of FIG. 8 as a $CLK_{IN}$ signal, and determines the polarity of the output of the DAC. The circuit of FIG. 9 comprises a first portion 902 for receiving control signals SIGN[N] and SIGN[N]_BAR to generate an output clock signal $CLK_{OUT}$ as a first phase, and a second portion 903 for receiving the clock signals SIGN[N] and SIGN[N]_BAR to generate an output clock signal $CLK_{OUT}$ as a second phase which is 180 degrees out of phase with the first phase. In particular, a first stage 902 comprises a transistor 904 coupled to receive one of the differential $CLK_{IN}$ inputs. The source of the transistor 904 is coupled to the drain of a current control transistor 906 coupled to receive a $V_{BIAS2}$ signal. Transistors 906 and 908 are coupled in series between the drain of transistor 904 and the reference voltage VCC as shown, and will be used to generate one of the differential outputs of the $CLK_{OUT}$ signal. Transistors 910 and 912 are also coupled in series to between the drain of transistor 904 and the reference voltage VCC as shown, and will be used to generate the other of the differential outputs of the $CLK_{OUT}$ signal. The signals at the drains of the transistors 910 and 912 are coupled a transistor 916, which is coupled in series with a transistor 918 to generate a clock signal of the differential output clock signal $CLK_{OUT}$ at the drains of the transistors 916 and 918. The drains of the transistors 906 and 908 are coupled to the gate of a transistor 920, which is coupled in series with a transistor 922 to generate a clock signal of the differential output clock signal $CLK_{OUT}$ at the drains of the transistors 920 and 922.

The second stage 903 comprises a transistor 926, the source of which is coupled to the drain of the current control transistor 906. The drains of transistors 928 and 930 are coupled to the drains of transistors 908 and 912, respectively, and will be used to generate one of the differential outputs of the $CLK_{OUT}$ signal based upon the state of the SIGN[N] signal. When the SIGN[N] signal is high, transistors 906 and 908 are on, coupling the $CLK_{IN}$ signal at the gate of the transistor 926 to the gate of transistor 916, where one of the clock signals of the differential output clock signal $CLK_{OUT}$ will be generated at the drains of the transistors 916 and 918 as shown. The SIGN[N] coupled to a second stage 903 will generate the differential $CLK_{IN}$ input to the second $CLK_{OUT}$ output. That is, transistor 930 will be on, and therefore the other differential $CLK_{IN}$ input will be coupled to the gate of the transistor 920. When the SIGN[N] signal is low, the differential inputs of the $CLK_{IN}$ signal will be switched with respect to the $CLK_{OUT}$ signal. In particular, when SIGN[N] is low, the opposite $CLK_{IN}$ inputs (compared to when SIGN[N] is high) will drive the gates transistors 910 and 928 to generate the $CLK_{OUT}$ signal. Accordingly, the circuit of FIG. 9 changes the sign of the $CLK_{OUT}$ signal relative to the $CLK_{IN}$ signal based upon the SIGN[N] signal.

Figure 10:
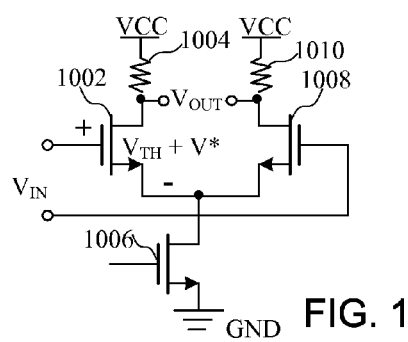
FIG. 10 is a block diagram of a portion of a DAC having NMOS transistors according to an embodiment.

Turning now to FIG. 10, a block diagram of a portion of a DAC according to an embodiment is shown. As shown in FIG. 10, a pair of transistors is coupled between VCC and ground, and is configured to receive a differential input voltage $V_{IN}$ and generate a differential output voltage $V_{OUT}$. In particular, a transistor 1002 is coupled to VCC by a transistor 1004 and to ground by a control transistor 1006. A second transistor 1008 is coupled to VCC by a second resistor 1010, where the sources of the transistors 1002 and 1008 are coupled together at the drain of the transistor 1006. The circuit of FIG. 10 could be implemented as the transistor pairs of the first and second stages of the DACs of FIGS. 8 and 9, for example.

The size of the switching NMOS transistors is chosen based on a PI optimization approach. Mismatch is estimated to determine the size of the switching NMOS transistors 1002 and 1008. Linearity determines V*, which combined with the size, can determine the tail current. V* is equal to the difference of the gate-to-source voltage and the threshold voltage ($V_{GS}-V_{TH}$) for a transistor, such as the NMOS transistors 1002 and 1008 of FIG. 10. If the PI current does not contain any limiting amplifier, the output is directly converted to a rail-to-rail signal. To achieve better linearity, V* should be as large as possible. It can be shown that when V* increases, the total harmonic distortion (THD) and INL decreases. However, a larger V* requires a large tail current, which increases power consumption. Moreover, if V* is too large, the drain voltage of current source will become very small and lead to non-ideal current source. A rule of thumb is to choose the amplitude of the input signal equal to V*.

The amplitude variation can be derived from the AM-to-PM modulation gain. If the AM-to-PM modulation gain is 0.14 degree/mV, for a 0.2-LSB, only 4-mV amplitude variation is allowed. Therefore, weighting coefficients can be selected based on this value. V* can determine the total harmonic distortion (THD) of the DAC, thus the INL of PI, and can be chosen to be 300-mV.

Figure 11:
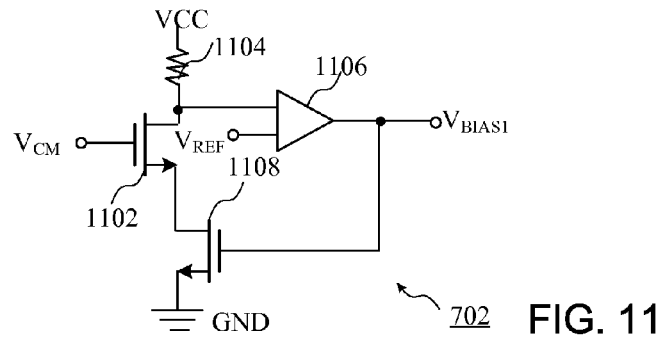
FIG. 11 is a block diagram of a first voltage bias circuit coupled to a first stage of the phase interpolator of FIG. 8 according to an embodiment.

Turning now to FIG. 11, a block diagram of a first constant voltage bias circuit of the phase interpolator of FIG. 8 is shown. A transistor 1102 is coupled to receive a common mode voltage $V_{CM}$ at its gate, and is coupled at a first terminal of a resistor 1104, which is coupled to VCC at a second terminal. The node at the first terminal of the resistor 1104 and the drain of transistor 1102 is coupled to a first input of a comparator, which receives a reference voltage $V_{REF}$ at a second input. The output of the comparator 1106 is coupled to the gate of a transistor 1108, which is coupled in series with the transistor 1102 between VCC and ground. The circuit of FIG. 11 enables the common-mode voltage tracks to PVT variation. Because the absolute amplitude does not affect the phase, the first constant bias voltage circuit of FIG. 11 provides a good operating point for the first stage of the DAC to ensure that the common-mode voltage, thus the PI, functions properly.

Figure 12:
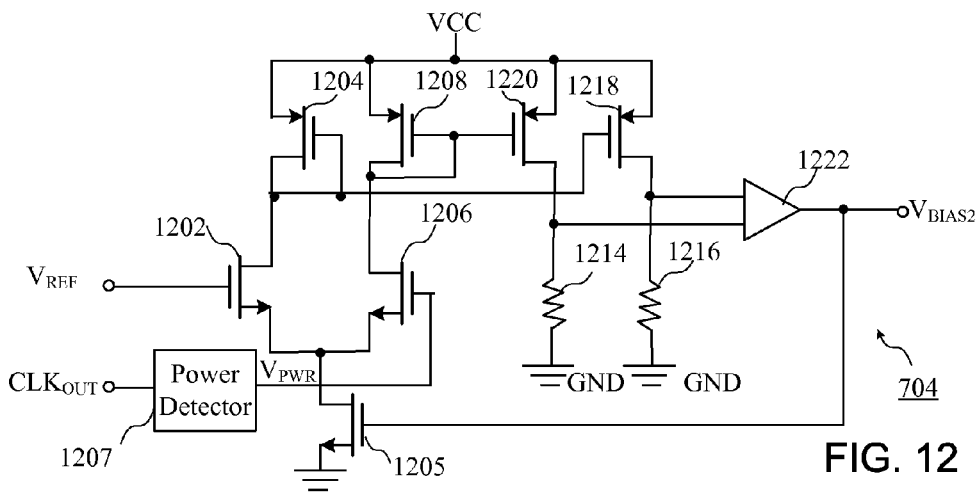
FIG. 12 is a block diagram of a second voltage bias circuit coupled to the second stage of the phase interpolator of FIG. 8 according to an embodiment.

Turning now to FIG. 12, a block diagram of a second constant voltage bias circuit of the phase interpolator of FIG. 8 according to an embodiment is shown. The second constant voltage bias circuit of FIG. 12 generates a second voltage bias $V_{BIAS2}$ based upon a reference voltage $V_{REF}$ and the power detected at the output of the first stage of the DAC. In particular, a transistor 1202 in a first path is coupled to receive a reference voltage $V_{REF}$ at its gate. The transistor 1202 is coupled in series with a transistor 1204 between the reference voltage VCC and a feedback transistor 1205 controlled by the second bias voltage $V_{BIAS2}$. A transistor 1206 in a second path is coupled to receive an output of a power detector which generates the power voltage $V_{PWR}$ based upon the power of the output clock signal $CLK_{OUT}$ of the first stage of a DAC as shown in FIG. 8. The transistor 1206 is coupled in series with a transistor 1208 in the second path between VCC and the feedback transistor 1205.

Voltages generated at nodes between the series transistors of the first and second paths are used to control the current in resistors 1214 and 1216 in third and fourth paths, respectively. More particularly, the node at the drains of the transistors 1202 and 1204 are coupled to the gate of a transistor 1218 of the fourth path, which comprises the transistor 1218 and resistor 1216 coupled in series between VCC and ground. Similarly, the node at the drains of the transistors 1206 and 1208 are coupled to the gate of a transistor 1220 of the third path, which comprises the transistor 1220 and resistor 1214 coupled in series between VCC and ground. The current mirroring arrangement of FIG. 12 ensures that the ratio of the current in the resistors 1214 and 1216 is equal to the ratio of the current in the transistors 1202 and 1206. The voltage at a node at the drain of the transistor 1218 and the resistor 1216 is coupled to a first input of a comparator 1222, and a voltage at a node at the drain of the transistor 1220 and the resistor 1214 is coupled to a second input of the comparator 1222. By employing the feedback path from the output of the comparator 1222 to the feedback transistor 1205, a constant voltage $V_{BIAS2}$ can be applied to the gate of the transistor 906 of the second stage of FIG. 9. Accordingly, the circuit of FIG. 12 is intended to trace V* under different PVT variations. As long as the input voltage swing is known, it is possible to ensure that the current is going to have a switching ratio of N:1. Because V* is directly proportional to the switching ratio, V* can be fixed, and thus control the THD caused by nonlinearity.

Figure 13:
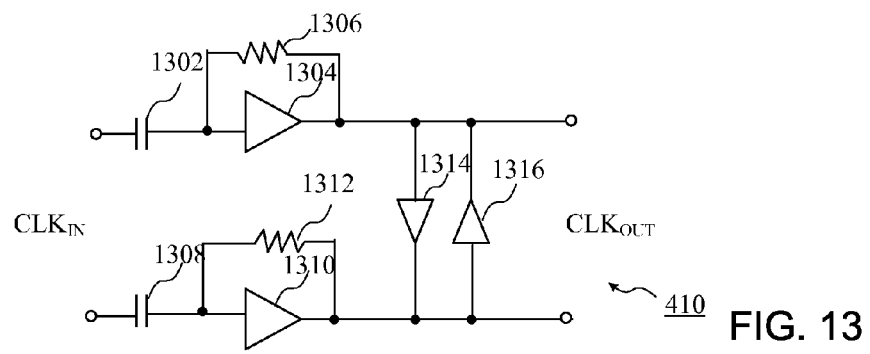
FIG. 13 is a block diagram of a conversion circuit according to an embodiment.

Turning now to FIG. 13, a block diagram of the voltage converter circuit 410 according to an embodiment is shown, where an output clock signal has a greater voltage swing than an input clock signal. The $CLK_{IN}$ signal of the differential input pair is coupled to a first terminal of a capacitor 1302, where a second terminal of the capacitor is coupled to a buffer 1304. The output of the buffer is coupled by a feedback resistor 1306 to the input of the buffer. The other phase of the $CLK_{IN}$ signal of the differential input pair is coupled to a first terminal of a capacitor 1308, where a second terminal of the capacitor is coupled to a buffer 1310. The output of the buffer is coupled by a feedback resistor 1312 to the input of the buffer. The circuit further includes buffers 1314 and 1316 across the output. The buffers 1304, 1310, 1314 and 1316 ensure that the output signal $CLK_{OUT}$ has a 50/50 duty cycle. While the circuit of FIG. 13 shows one example of a conversion circuit, it should be understood that other circuits could be implemented for converting a differential clock signal from one voltage to another voltage.

Figure 14:
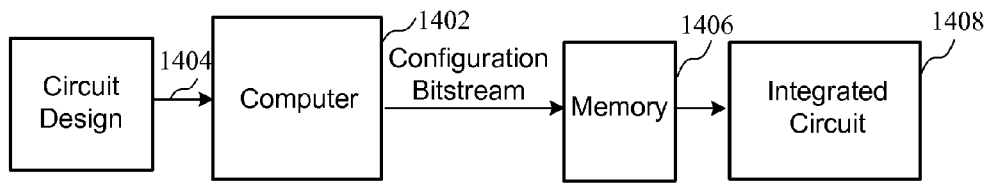
FIG. 14 is a block diagram of a system for programming a device having programmable resources according to an embodiment.

Turning now to FIG. 14, a block diagram of a system for programming a device having programmable resources according to an embodiment is shown. In particular, a computer 1402 is coupled to receive a circuit design 1404 from a memory 1406, and generate a configuration bitstream which is stored in the non-volatile memory 1406. As will be described in more detail below, the circuit design may be a high level design, such as a circuit design defined in a hardware description language (HDL). Also, the computer may be configured to run software that generates a configuration bitstream which is stored in the non-volatile memory 1408 and provided to an integrated circuit 1410 which may be a programmable integrated circuit, such as the integrated circuit described below in FIG. 15.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 1402 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 15:
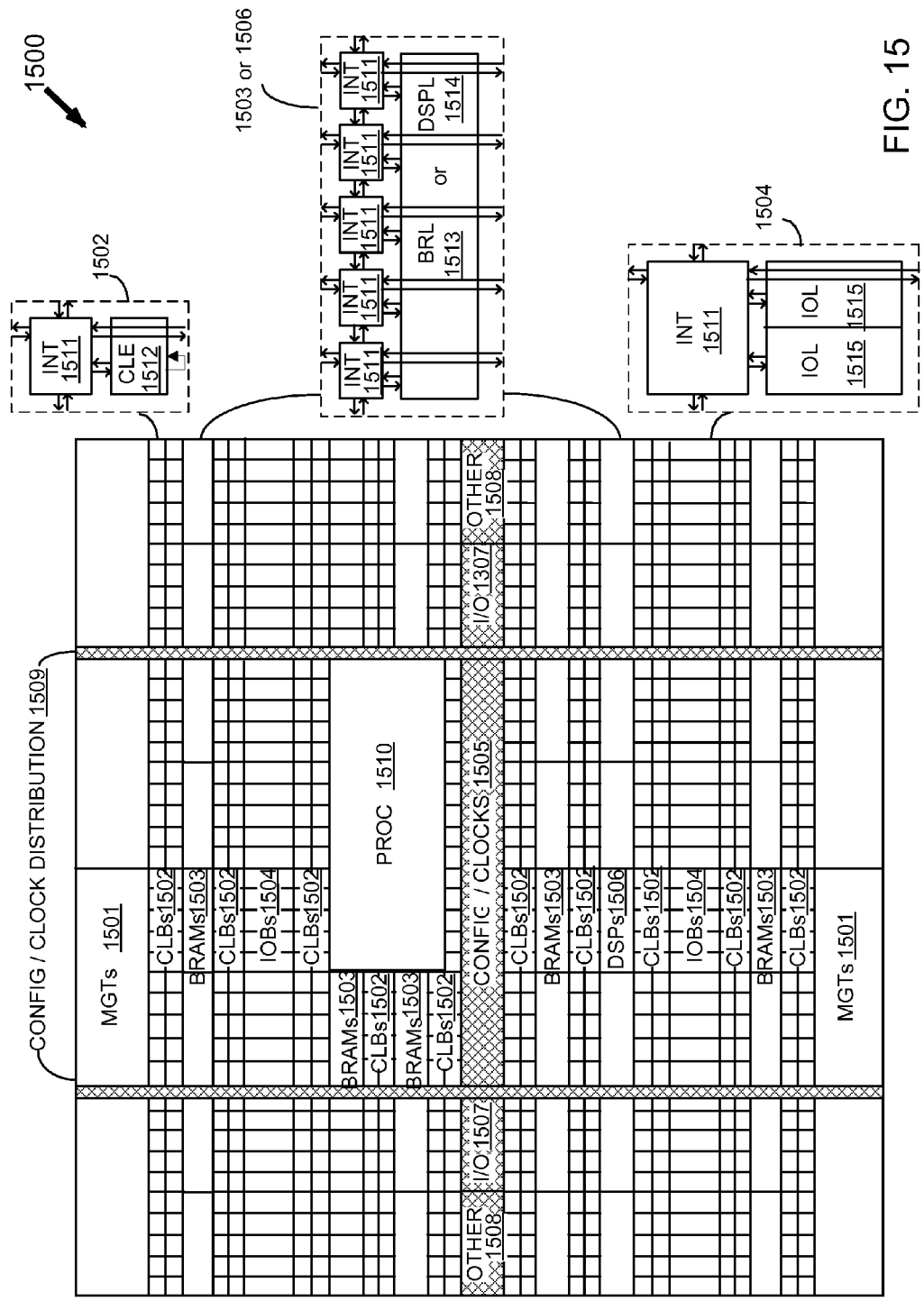
FIG. 15 is a block diagram of a device having programmable resources including the circuits of FIGS. 4-13.

Turning now to FIG. 15, a block diagram of a device having programmable resources, including memory elements as described above, is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 15 comprises an FPGA architecture 1500 having a large number of different programmable tiles including multi-gigabit transceivers (MGTs) 1501, CLBs 1502, random access memory blocks (BRAMs) 1503, input/output blocks (IOBs) 1504, configuration and clocking logic (CONFIG/CLOCKS) 1505, digital signal processing blocks (DSPs) 1506, specialized input/output blocks (I/O) 1507 (e.g., configuration ports and clock ports), and other programmable logic 1508 such as digital clock managers, analog-to-digital converters, system monitoring logic, and so forth. Some FPGAs also include dedicated processor blocks (PROC) 1510, which may be used to implement a software application, for example.

In some FPGAs, each programmable tile includes a programmable interconnect element (INT) 1511 having standardized connections to and from a corresponding interconnect element in each adjacent tile. Therefore, the programmable interconnect elements taken together implement the programmable interconnect structure for the illustrated FPGA. The programmable interconnect element 1511 also includes the connections to and from the programmable logic element within the same tile, as shown by the examples included at the top of FIG. 15.

For example, a CLB 1502 may include a configurable logic element (CLE) 1512 that may be programmed to implement user logic plus a single programmable interconnect element 1511. A BRAM 1503 may include a BRAM logic element (BRL) 1513 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1506 may include a DSP logic element (DSPL) 1514 in addition to an appropriate number of programmable interconnect elements. An IOB 1504 may include, for example, two instances of an input/output logic element (IOL) 1515 in addition to one instance of the programmable interconnect element 1511. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Config/Clock distribution regions 1509 extending from this column are used to distribute the clocks and configuration signals across the breadth of the FPGA. Some FPGAs utilizing the architecture illustrated in FIG. 15 include additional logic blocks that disrupt the regular columnar structure making up a large part of the FPGA. The additional logic blocks may be programmable blocks and/or dedicated logic. For example, the processor block PROC 1510 shown in FIG. 15 spans several columns of CLBs and BRAMs.

Note that FIG. 15 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 15 are purely exemplary. For example, in an actual FPGA more than one adjacent column of CLBs is typically included wherever the CLBs appear in order to facilitate the efficient implementation of user logic. While the embodiment of FIG. 15 relates to an integrated circuit having programmable resources, it should be understood that the circuits and methods set forth in more detail below could be implemented in any type of ASIC.

Figure 16:
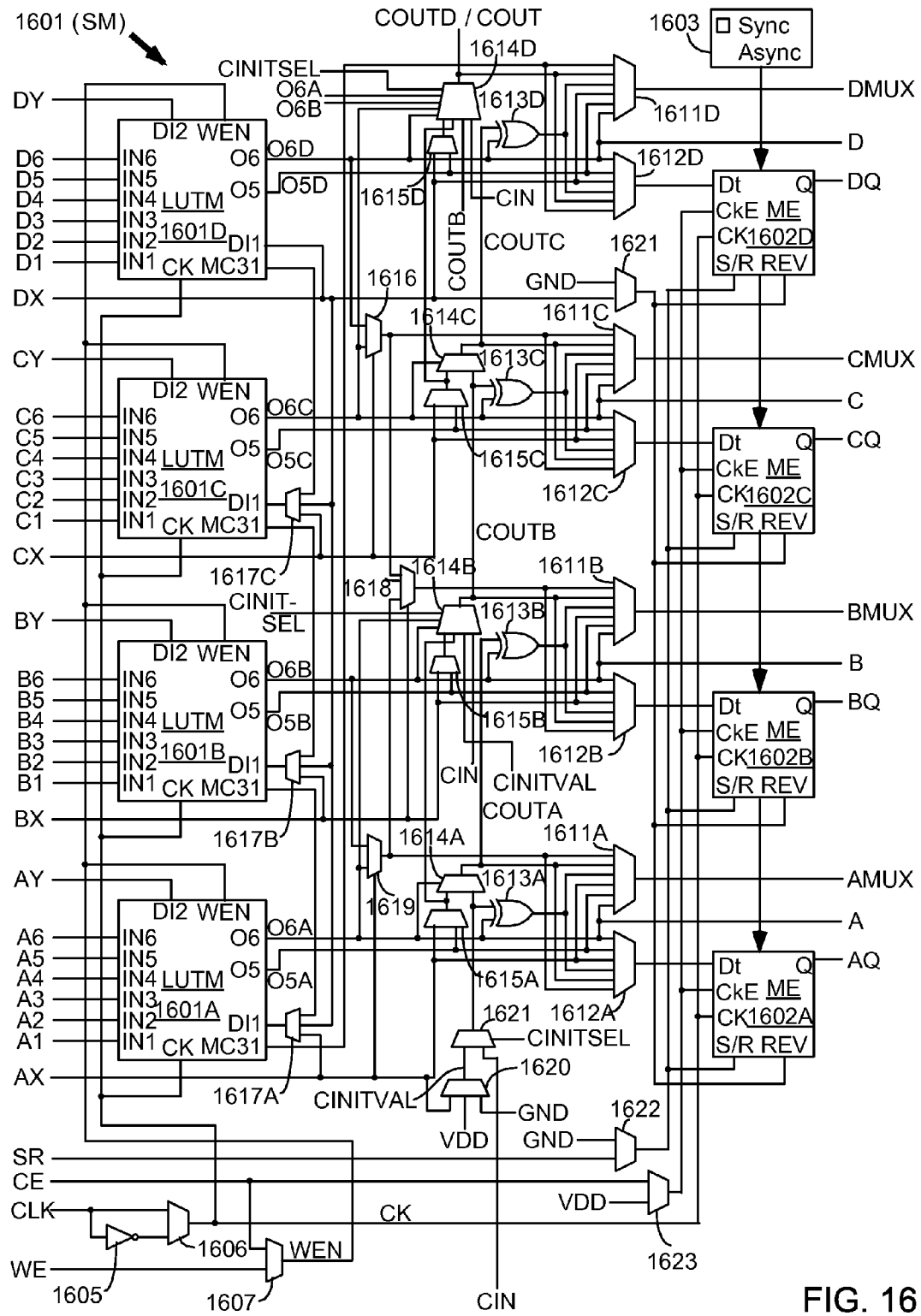
FIG. 16 is a block diagram of a configurable logic element of the device of FIG. 15.

Turning now to FIG. 16, a block diagram of a configurable logic element of the device of FIG. 15 according to an embodiment is shown. In particular, FIG. 16 illustrates in simplified form a configurable logic element of a configuration logic block 1502 of FIG. 15. In the embodiment of FIG. 16, slice M 1601 includes four lookup tables (LUTMs) 1601A-1601D, each driven by six LUT data input terminals A1-A6, B1-B6, C1-C6, and D1-D6 and each providing two LUT output signals O5 and O6. The O6 output terminals from LUTs 1601A-1601D drive slice output terminals A-D, respectively. The LUT data input signals are supplied by the FPGA interconnect structure via input multiplexers, which may be implemented by programmable interconnect element 1611, and the LUT output signals are also supplied to the interconnect structure. Slice M also includes: output select multiplexers 1611A-1611D driving output terminals AMUX-DMUX; multiplexers 1612A-1612D driving the data input terminals of memory elements 1602A-1602D; combinational multiplexers 1616, 1618, and 1619; bounce multiplexer circuits 1622-1623; a circuit represented by inverter 1605 and multiplexer 1606 (which together provide an optional inversion on the input clock path); and carry logic having multiplexers 1614A-1614D, 1615A-1615D, 1620-1621 and exclusive OR gates 1613A-1613D. All of these elements are coupled together as shown in FIG. 16. Where select inputs are not shown for the multiplexers illustrated in FIG. 16, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 16 for clarity, as well as from other selected figures herein.

In the pictured embodiment, each memory element 1602A-1602D may be programmed to function as a synchronous or asynchronous flip-flop or latch. The selection between synchronous and asynchronous functionality is made for all four memory elements in a slice by programming Sync/Asynch selection circuit 1603. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1602A-1602D are clocked by a clock signal CK, which may be provided by a global clock network or by the interconnect structure, for example. Such programmable memory elements are well known in the art of FPGA design. Each memory element 1602A-1602D provides a registered output signal AQ-DQ to the interconnect structure. Because each LUT 1601A-1601D provides two output signals, O5 and O6, the LUT may be configured to function as two 5-input LUTs with five shared input signals (IN1-IN5), or as one 6-input LUT having input signals IN1-IN6.

In the embodiment of FIG. 16, each LUTM 1601A-1601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1617A-1617C for LUTs 1601A-1601C), or to the two 32-bit RAMs via input terminals DI1 and DI2. RAM write operations in the LUT RAMs are controlled by clock signal CK from multiplexer 1606 and by write enable signal WEN from multiplexer 1607, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1601A may also be provided to the general interconnect structure for shift register chaining, via output select multiplexer 1611D and CLE output terminal DMUX. Accordingly, the circuits and methods set forth above may be implemented in a device such as the devices of FIGS. 15 and 16, or any other suitable device.

Figure 17:
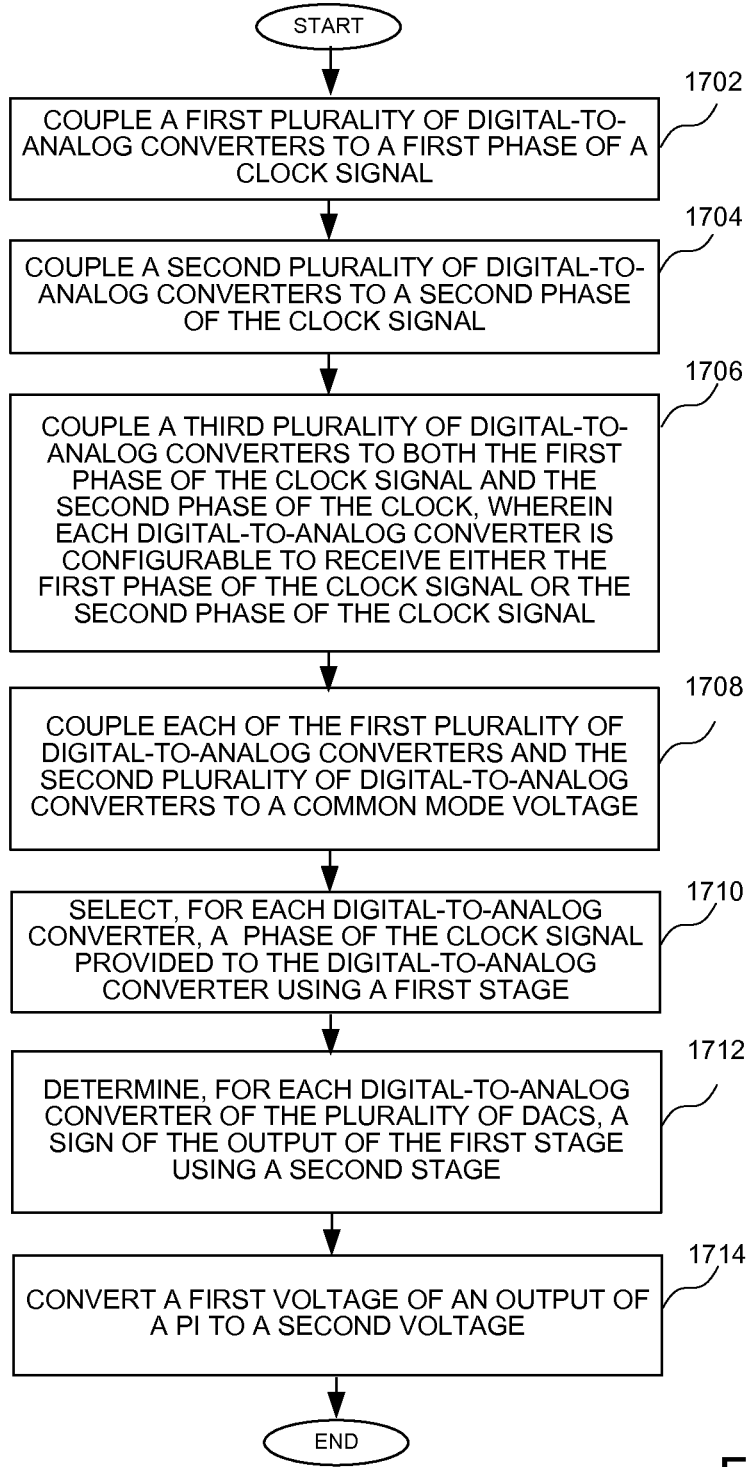
FIG. 17 is flow chart showing a method of implementing a phase interpolator according to an embodiment.

FIG. 17 is flow chart showing a method of implementing a phase interpolator according to an embodiment. In particular, a first plurality of digital-to-analog converters is coupled to a first phase of a clock signal at a step 1702. A second plurality of digital-to-analog converters is coupled to a second phase of the clock signal at a step 1704. A third plurality of digital-to-analog converters is coupled to both the first phase of the clock signal and the second phase of the clock, wherein each digital-to-analog converter is configurable to receive either the first phase of the clock signal or the second phase of the clock signal at a step 1706. Each of the first plurality of digital-to-analog converters and the second plurality of digital-to-analog converters are coupled to a common mode input at a step 1708. For each digital-to-analog, a phase of the clock signal provided to the digital-to-analog converter is selected using a first stage at a step 1710. For each digital-to-analog converter of the third plurality of DACs, a sign of the output of the first stage is determined using a second stage at a step 1712. A first voltage of the output is optionally converted to a second voltage at a step 1714.

It can therefore be appreciated that a new phase interpolator and method of implementing a phase interpolator has been described. It will be appreciated by those skilled in the art that numerous alternatives and equivalents will be seen to exist which incorporate the disclosed invention. As a result, the invention is not to be limited by the foregoing embodiments, but only by the following claims.

I claim:
1. A phase interpolator comprising:
a first plurality of digital-to-analog converters coupled to receive a first phase of a clock signal;
a second plurality of digital-to-analog converters coupled to receive a second phase of the clock signal;
a third plurality of digital-to-analog converters coupled to both the first phase of the clock signal and the second phase of the clock; wherein each digital-to-analog converter of the third plurality of digital-to-analog converters is configurable to receive either the first phase of the clock signal or the second phase of the clock signal; and
a control circuit coupled to generate control signals for the third plurality of digital-to-analog converters based upon a phase code associated with a phase of an output clock signal, wherein the control signals configure digital-to-analog converters of the third plurality of digital- to-analog converters to receive either the first phase of the clock signal or the second phase of the clock signal.

2. The phase interpolator of claim 1 wherein the first plurality of digital-to-analog converters comprises a first fixed number of digital-to-analog converters and the second plurality of digital-to-analog converters comprises a second fixed number of digital-to-analog converters.

3. The phase interpolator of claim 1 wherein a first number of digital-to-analog converters of the third plurality of digital-to-analog converters is configured to receive the first phase of the clock signal and a second number of digital-to-analog converters is configured to receive the second phase of the clock signal based upon the phase of the output clock signal.

4. The phase interpolator of claim 1 wherein each digital-to-analog converter of the third plurality of digital-to-analog converters receives a control signal which selects either the first phase of the clock signal or the second phase of the clock signal.

5. The phase interpolator of claim 1 wherein each of the first plurality of digital-to-analog converters and the second plurality of digital-to-analog converters is coupled to receive a common mode input and a control signal which selects either a phase of the clock signal or a common mode signal.

6. The phase interpolator of claim 1 wherein each digital-to-analog converter of the third plurality of digital-to-analog converters comprises a first stage which determines whether the first phase or the second phase of the clock signal is selected to generate the output clock signal.

7. The phase interpolator of claim 6 wherein each digital-to-analog converter of the third plurality of analog-to-digital converters comprises a second stage which determines a sign of an output of the first stage.

8. A phase interpolator comprising:
a plurality of digital-to-analog converters; and
a control circuit coupled to the plurality of digital-to-analog converters;
wherein a portion of the plurality of digital-to-analog converters are coupled to receive control signals, based upon a phase code associated with a phase of an output clock signal, from the control circuit which enable receiving, for each digital-to-analog converter of the portion of digital-to-analog converters, either a first phase of a clock signal or a second phase of the clock signal.

9. The phase interpolator of claim 8 wherein each digital-to-analog converter of the portion of digital-to-analog converters comprises a first stage which determines a phase of the clock signal that is selected to generate the output clock signal.

10. The phase interpolator of claim 9 wherein each digital-to-analog converter of the portion of digital-to-analog converters comprises a constant voltage bias circuit providing a constant voltage bias signal to the first stage of the digital-to-analog converter.

11. The phase interpolator of claim 9 wherein each digital-to-analog converter of the portion of digital-to-analog converters comprises a second stage which determines a sign of an output of the first stage.

12. The phase interpolator of claim 11 further comprising, for each digital-to-analog converter of the portion of digital-to-analog converters, a second constant voltage bias circuit coupled to the second stage of the digital-to-analog circuit, the second constant voltage bias circuit enabling a control transistor of the second stage to maintain a constant voltage drop across a gate and a drain of a switching transistor.

13. The phase interpolator of claim 8 wherein each digital-to-analog converter of a second portion of digital-to-analog converters is coupled to receive a common mode input.

14. The phase interpolator of claim 13 wherein each digital-to-analog converter of the second portion of digital-to-analog converters receives a control signal which selects either a phase of the clock signal or a common mode signal.

15. A method of implementing a phase interpolator, the method comprising:
coupling a first phase of a clock signal to a first plurality of digital-to-analog converters;
coupling a second phase of the clock signal to a second plurality of digital-to-analog converters; and
coupling both the first phase of the clock signal and the second phase of the clock to a third plurality of digital-to-analog converters, wherein each digital-to-analog converter of the third plurality of digital-to-analog converters is configurable to receive either the first phase of the clock signal or the second phase of the clock signal; and
coupling a control circuit to generate control signals for the third plurality of digital-to-analog converters based upon a phase code associated with a phase of an output clock signal, wherein the control signals configure digital-to-analog converters of the third plurality of digital-to-analog converters to receive either the first phase of the clock signal or the second phase of the clock signal.

16. The method of claim 15 wherein coupling both the first phase of the clock signal and the second phase of the clock signal to a third plurality of digital-to-analog converters comprises configuring a first number of digital-to-analog converters of the third plurality of digital-to-analog converters to receive the first phase of the clock signal based upon the phase of the output clock signal.

17. The method of claim 15 wherein coupling both the first phase of the clock signal and the second phase of the clock to a third plurality of digital-to-analog converters comprises configuring a second number of digital-to-analog converters of the third plurality of digital-to-analog converters to receive the second phase of the clock signal based upon the phase of the output clock signal.

18. The method of claim 15 further comprising coupling a common mode input to each of the first plurality of digital-to-analog converters and the second plurality of digital-to-analog converters.

19. The method of claim 15 further comprising selecting, for each digital-to-analog converter of the third plurality of digital-to-analog converters, either the first phase or the second phase of the clock signal using a first stage.

20. The method of claim 19 further comprising determining, for each digital-to-analog converter of the third plurality of digital-to-analog converters, a sign of an output of the first stage using a second stage.

* * * * *